United States Patent [19]
Murao

[11] Patent Number: 4,760,490
[45] Date of Patent: Jul. 26, 1988

[54] PROXIMITY SWITCH DEVICE

[75] Inventor: Eiji Murao, Saitama, Japan

[73] Assignee: Honda Giken Kogyo Kabushiki Kaisha, Tokyo, Japan

[21] Appl. No.: 930,079

[22] Filed: Nov. 12, 1986

Related U.S. Application Data

[63] Continuation of Ser. No. 777,624, Sep. 19, 1985, abandoned.

[30] Foreign Application Priority Data

Oct. 17, 1984 [JP] Japan .............................. 59-157063[U]

[51] Int. Cl.$^4$ ............................................. H01H 47/12
[52] U.S. Cl. ..................................................... 361/181
[58] Field of Search ......................................... 361/181

[56] References Cited

U.S. PATENT DOCUMENTS

| | | | |
|---|---|---|---|
| 3,575,640 | 4/1971 | Ishikawa | 361/181 |
| 3,829,850 | 8/1974 | Guetersloh | 36/181 X |
| 4,352,141 | 9/1982 | Kent | 361/181 |

Primary Examiner—Michael L. Gellner
Attorney, Agent, or Firm—Lyon & Lyon

[57] ABSTRACT

A proximity switch device adapted to provide a contactless switching function for an electric device, such as a radio mounted in a vehicle when approached by an object, such as a driver's hand including a floating capacitance detector and an amplified oscillator circuit for converting a change in floating capacitance into a change in frequency signal, a voltage fluctuation detecting circuit for detecting an approach of the object based upon said frequency signal, and a flip-flop switch for switching on and off the electric device whenever an output signal indicating the approach of the object is produced.

2 Claims, 3 Drawing Sheets

...

PROXIMITY SWITCH DEVICE

This application is a continuation of application Ser. No. 777,624, filed 9/19/85, now abandoned.

FIELD OF THE INVENTION

The present invention relates to a proximity switch device for detecting the approach of an object and switching on and off an associated apparatus.

BACKGROUND OF THE INVENTION

In the prior art, an electrical apparatus such as a radio mounted in a vehicle is switched on and off by use of a push-type switch. This switch, however, has poor operability in that during the running of the vehicle, the driver must reach for and operate the switch knob which may be very distracting.

OBJECT OF THE INVENTION

Therefore, it is an object of the present invention to provide a proximity switch device wherein merely the approach of a hand thereto causes the switching on and off of an associated electric apparatus without any manual operation of the switch knob when the electric apparatus is to be switched on and off.

SUMMARY OF THE INVENTION

In accordance with the present invention, there is provided a proximity switch device which detects a change in floating capacitance due to the approach of an object (i.e. a hand of the person) to an electrode plate and causes a contactless switching function of an associated apparatus.

BRIEF DESCRIPTION OF THE DRAWINGS

The invention will be explained with reference to the drawings in which.

DETAILED DESCRIPTION OF THE PREFERRED EMBODIMENT

Figure 1:
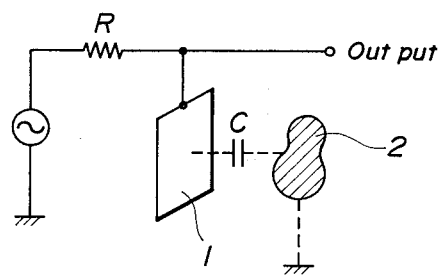
FIG. 1 is a schematic view which is used for explaining the basic principle of the present invention by which an object is detected.

Referring now to FIG. 1 which illustrates the basic principle of the present invention by which an object is detected, when a R. F. signal is applied to a series circuit comprising an electrode plate 1 and a resistor R, a floating capacitance C is varied depending upon the distance between the electrode plate 1 and an object 2 to be detected, and the R. F. output voltage on a node between the electrode plate 1 and the resistor R is also varied. Therefore, the electrode plate 1 can be used as a sensor, which detects when the object 2 is approaching by sensing a decrease of said output voltage.

Figure 2:
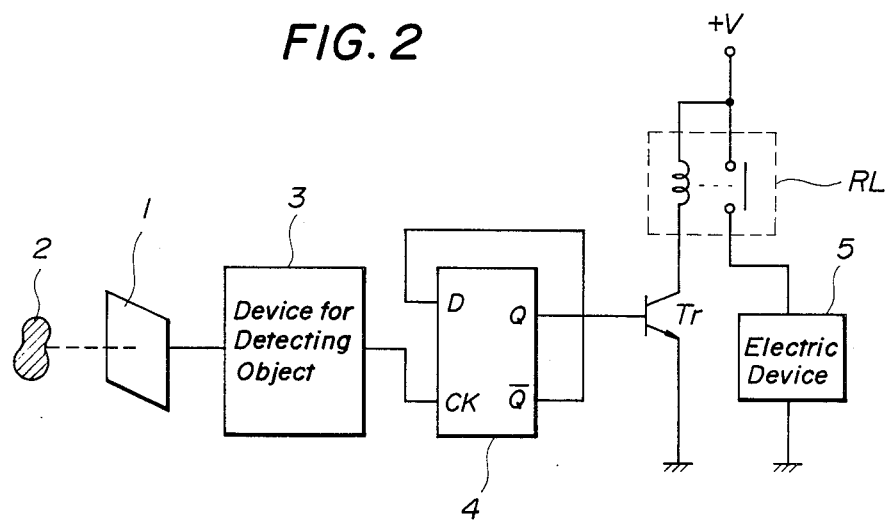
FIG. 2 is a block diagram illustrating an embodiment of a proximity switch device according to the present invention.

Referring to FIG. 2 which illustrates an embodiment of the present invention, a proximity switch device constructed in accordance with the basic principle as stated above comprises an object detector 3 for detecting the approach of the object 2 to the sensor 1, a flip-flop 4 which changes state in response to an output signal from the object detector 3 indicating the approach of the object 2, a switching transistor Tr which is turned on and off based upon the state of the Q output of said flip-flop 4, and a relay switch RL which is energized and deenergized through the switching transistor Tr. An electric device 5, such as a radio is connected to complete its power supply circuit through contact "a" of said relay.

Figure 3:
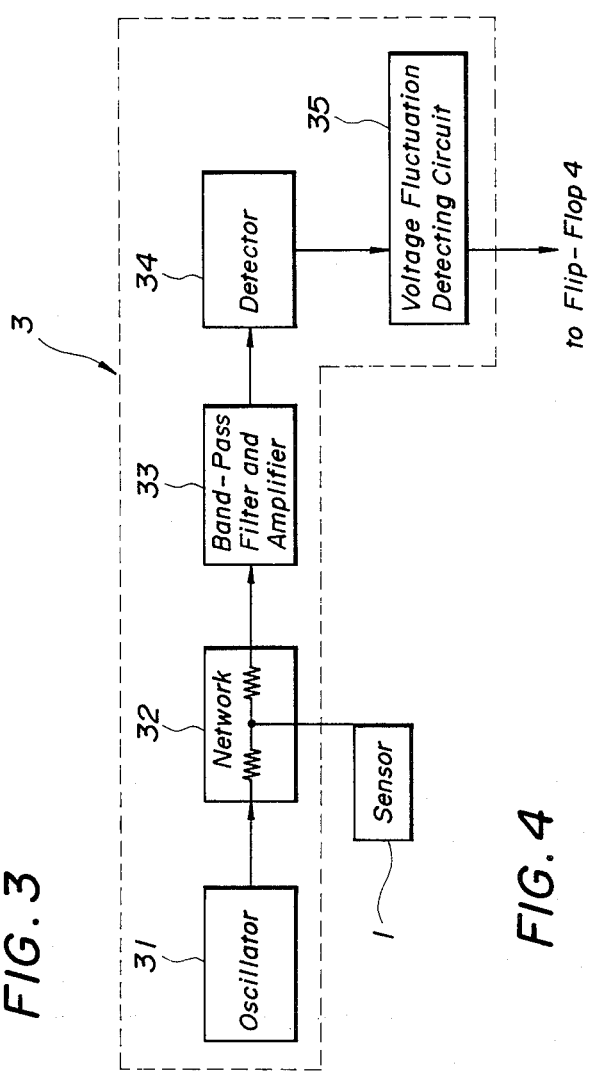
FIG. 3 is a block diagram illustrating an object detector of said proximity switch device.

The object detector 3 is more precisely shown in FIG. 3. Referring to FIG. 3, the object detector 3 comprises an oscillator 31 for producing a constant frequency signal, a network 32 which is connected to the output of said oscillator 31 and has a sensor 1 connected to a midpoint of the resistors in the network, a band-pass filter and amplifier 33 for noise suppressing and amplifying a R. F. voltage output signal produced by said network 32, a detector 34 for detecting the amplified output signal, and a voltage fluctuation detecting circuit 35 which senses a decrease of said detected voltage signal (i.e. an approach of the object) and produces a switch-on command to said flip-flop 4 when said decrease of the voltage signal exceeds a preselected limit.

In such an arrangement, it is to be understood that the network 32, when supplied with a R. F. signal of a constant frequency Fo from the oscillator 32, produces a properly attenuated R. F. output voltage in proportion to the distance between the sensor 1 and the approaching object 2. The R. F. output voltage is supplied to the band-pass filter and amplifier 33 where the noise induced in the sensor 1 and the like is eliminated and only the R. F. component of frequency Fo is amplified. The amplified frequency signal is detected in the detector 34 which produces a D. C. voltage signal having an amplitude corresponding to that of the input frequency signal to the voltage fluctuation detecting circuit 35. Then, the voltage fluctuation detecting circuit 35 senses the decrease of the D. C. voltage signal supplied thereto and produces the switch-on command to the flip-flop 4 indicating the presence of the object 2 when said decrease of the voltage signal exceeds the preselected limit. The Q output of the flip-flop 4 goes to high level, thereby turning on the switching transistor Tr. This causes the relay switch RL to be energized to close its contacts. Accordingly, the electric device 5 is switched on.

In addition, during the time that the electric device 5 remains switched on, when the object 2 once again approaches the sensor 1, the presence of the object 2 is also detected by the voltage fluctuation detecting circuit 35 which produces a switch-off command to the flip-flop 4 for changing its state. Then the Q output of the flip-flop 4 goes to low level, thereby turning off the transistor Tr. The relay switch RL is deenergized to open its "contacts", with the result that the electric device 5 is switched off.

Figure 4:
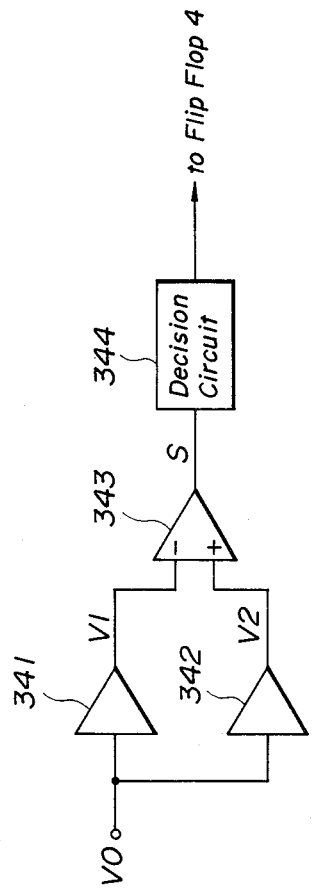
FIG. 4 is a block diagram illustrating a voltage fluctuation detection circuit in said object detector.

Referring now to FIG. 4, the voltage fluctuation detecting circuit 35 comprises a first amplifier 341 for amplifying the output voltage Vo of the detector 34, a second amplifier 342 for amplifying the same output voltage Vo and introducing a certain delay, a comparator 343 for comparing the amplified output voltages V1 and V2 of both first and second amplifiers, and a decision circuit 344 for determing whether or not the time duration of the output signal S of said comparator 343 exceeds the preselected value. The amplifiers 341 and 342 are arranged to have the same gain. An offset voltage of the comparator 343 is adjusted such that it produces a low level output when V1≧V2 and a high level output when V1<V2.

Figure 5:
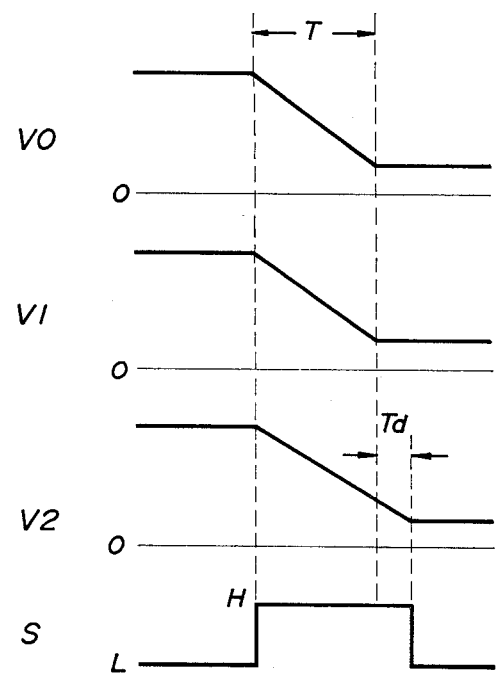
FIG. 5 is a timing diagram illustrating the signals appearing on various points of said voltage fluctuation detection circuit.

In such an arrangement of the voltage fluctuation detecting circuit and referring to FIG. 5, as the input voltage Vo decreases with a period T, the output voltage V1 of the amplifier 341 also decreases with the same period T, but the output voltage V2 of the amplifier 342 decreases with a certain time delay Td. As a consequence, in the time interval of T+Td, the voltage V1 becomes smaller than the voltage V2 (V1<V2) so that the output S of the comparator 343 remains at high level. However, considering the fact that the decrease period T of the input voltage Vo varies with the distance between the sensor 1 and the object 2, the decision circuit 344 determines that the object 2 has been detected when the time duration of the output S exceeds the preselected value and produces alternately the switch-on and -off commands to the flip-flop 4. In this connection it is to be noted that when the position of the object 2 remains stationary with regard to the sensor 1 so that the input voltage Vo remains constant, the voltage V1 becomes equal to the voltage V2 (V1=V2), whereas when the object 2 moves away from the sensor 1, the voltage V1 becomes greater than the voltage V2 (V1>V2). In either case, the output S of the comparator becomes low level, which produces no switching command.

Thus the proximity switch device according to the present invention provides a contactless switching function for the electric device 5 by merely the approach of the object 2 (e.g. a hand of the person) to the sensor 1. More specifically, it provides a good operating feature for an electric device such as an autoradio mounted in the vehicle in that it can easily be switched on and off even when the vehicle is running without requiring careful attention and reaching of the driver. Further, the present invention can be effectively utilized in the case of a household appliance, for example a desk lamp, that is to be switched on in the darkness. In addition, the present invention is useful not only for switching of an electric device, but also for operation of an alarm system in which the sensor 1 is mounted near the door and the electric device 5 is replaced by an alarm device which produces an audible signal when approached by anyone to the door.

It is apparent from the foregoing that the present invention provides a proximity switch device which comprises means for converting a change in floating capacitance between an electrode plate, i.e. sensor, and an object to be detected into a change in frequency signal, means for detecting an approach of said object in response to the attenuation of said frequency signal, and means for alternately switching on and off an electric device every time the output signal indicative of detection of said object is produced. The device of the present invention is of a relatively simple construction but provides a reliable a contactless switching function for an electric device.

I claim:

1. A proximity switch characterized in that it comprises means for converting a change in floating capacitance between a sensor comprising an electrode plate and object to be detected into a change in frequency signal; means for detecting an approach of said object in response to the attenuation of said frequency signal; means for alternately switching on and off an electric device every time when an output signal indicative of detection of said object is produced; wherein said switch device comprises an oscillator for producing a constant frequency signal; a network connected to an output of said oscillator and having a sensor connected to a point between resistors in the network; a band-pass filter and amplifier for noise suppressing and amplifying R. F. output voltage from said network; a detector for detecting the amplified output signal from said band-pass filter and amplifier; a voltage fluctuation detecting circuit for sensing a decrease of said detected voltage signal that exceeds a preselected limit; a flip-flop which changes state in response to an output signal of said voltage fluctuation detecting circuit; a switching element which is turned on and off depending upon an output signal of said flip-flop; and a relay which is energized when said switching element is turned on to perform the switch-on of the electric device.

2. The proximity switch device according to claim 1 wherein said voltage fluctuation detecting circuit includes a first amplifier for amplifying the output voltage of said detector; a second amplifier for amplifying the same output voltage and introducing a certain time delay; a comparator for comparing the both amplified output voltages; and a decision circuit for determining whether or not the time duration of the output signal from said comparator exceeds a preselected value.

* * * * *